US 12,490,546 B2

(12) United States Patent
Jin et al.

(10) Patent No.: US 12,490,546 B2
(45) Date of Patent: Dec. 2, 2025

(54) PHOTOVOLTAIC CELL, METHOD FOR PRODUCING THE SAME AND PHOTOVOLTAIC MODULE

(71) Applicants: ZHEJIANG JINKO SOLAR CO., LTD., Zhejiang (CN); JINKO SOLAR CO., LTD., Jiangxi (CN)

(72) Inventors: Jingsheng Jin, Zhejiang (CN); Guangming Liao, Zhejiang (CN); Nannan Yang, Zhejiang (CN)

(73) Assignees: ZHEJIANG JINKO SOLAR CO., LTD., Haining (CN); JINKO SOLAR CO., LTD., Jiangxi (CN)

( * ) Notice: Subject to any disclaimer, the term of this patent is extended or adjusted under 35 U.S.C. 154(b) by 6 days.

(21) Appl. No.: 18/395,452

(22) Filed: Dec. 22, 2023

(65) Prior Publication Data
US 2024/0282882 A1 Aug. 22, 2024

(30) Foreign Application Priority Data
Feb. 21, 2023 (CN) .......................... 202310145791.6

(51) Int. Cl.
H10F 71/00 (2025.01)
H10F 10/14 (2025.01)
(Continued)

(52) U.S. Cl.
CPC ......... H10F 77/219 (2025.01); H10F 10/146 (2025.01); H10F 10/165 (2025.01);
(Continued)

(58) Field of Classification Search
CPC .... H10F 77/219; H10F 10/146; H10F 10/165; H10F 71/131; H10F 77/311;
(Continued)

(56) References Cited

U.S. PATENT DOCUMENTS 8,574,951 B1 * 11/2013 Wang ...................... H10F 71/00
257/E31.124
9,559,236 B2 * 1/2017 Rim ..................... H10F 77/1642
(Continued)

FOREIGN PATENT DOCUMENTS

CN 110890443 A 3/2020
CN 110896117 A 3/2020
(Continued)

OTHER PUBLICATIONS

Zhejiang Jinko Solar Co., Ltd et al., Extended European Search Report, EP 23219417.5, May 29, 2024, 9 pgs.

Primary Examiner — Earl N Taylor
(74) Attorney, Agent, or Firm — USCH Law, PC

(57) ABSTRACT

Disclosed are a photovoltaic cell, a method for producing the same and a photovoltaic module. The method includes providing a silicon wafer; forming a tunneling oxide layer on the silicon wafer and a P-type amorphous silicon layer over the tunneling oxide layer; forming N-type dopants on the P-type amorphous silicon layer; performing laser processing on the N-type dopants to cause the P-type amorphous silicon layer to be converted into an amorphous silicon layer having alternatingly arranged P-type amorphous silicon and N-type amorphous silicon; removing the N-type dopant on the amorphous silicon layer and forming a protective layer over the amorphous silicon layer; performing processing on the protective layer and the amorphous silicon layer to form a groove and a protrusion; subjecting the silicon wafer to further processing to increase a depth of the groove; removing the protective layer; and subjecting the silicon wafer to high temperature processing.

18 Claims, 6 Drawing Sheets

(51) Int. Cl.
*H10F 10/165* (2025.01)
*H10F 77/20* (2025.01)
*H10F 77/30* (2025.01)
*H10F 77/70* (2025.01)

(52) U.S. Cl.
CPC ......... *H10F 71/131* (2025.01); *H10F 77/311* (2025.01); *H10F 77/315* (2025.01); *H10F 77/703* (2025.01); *Y02P 70/50* (2015.11)

(58) Field of Classification Search
CPC ...... H10F 77/315; H10F 77/703; Y02P 70/50; H01L 31/1872; H01L 31/0745; H01L 31/0682; H01L 31/02363; H01L 31/02167; H01L 31/02168; H01L 31/022441; H01L 31/1804; H01L 31/068
See application file for complete search history.

(56) References Cited

U.S. PATENT DOCUMENTS

| | | | | |
|---|---|---|---|---|
| 9,947,812 | B2* | 4/2018 | Harley | H10F 10/146 |
| 2012/0138135 | A1* | 6/2012 | Manning | H10F 77/219 |
| | | | | 257/E31.124 |
| 2012/0266951 | A1* | 10/2012 | Li | H10F 71/128 |
| | | | | 257/E31.13 |
| 2015/0280029 | A1 | 10/2015 | Harley et al. | |
| 2015/0280043 | A1* | 10/2015 | Smith | H10F 71/121 |
| | | | | 136/258 |
| 2016/0087140 | A1 | 3/2016 | Rim et al. | |
| 2018/0277701 | A1 | 9/2018 | Lenes et al. | |

FOREIGN PATENT DOCUMENTS

| | | |
|---|---|---|
| CN | 113299770 A | 8/2021 |
| JP | 2012511258 A | 5/2012 |
| JP | 2013538009 A | 10/2013 |
| JP | 2014504003 A | 2/2014 |
| JP | 2015138959 A | 7/2015 |
| JP | 2017118112 A | 6/2017 |
| JP | 2017517147 A | 6/2017 |
| JP | 2017143267 A | 8/2017 |
| JP | 2019209259 A | 12/2019 |
| TW | 202209694 A | 3/2022 |
| WO | 2022199883 A2 | 9/2022 |

\* cited by examiner

PHOTOVOLTAIC CELL, METHOD FOR PRODUCING THE SAME AND PHOTOVOLTAIC MODULE

CROSS REFERENCE TO RELATED APPLICATIONS

This application claims priority to Chinese Patent Application No. CN202310145791.6, filed on Feb. 21, 2023, which is incorporated by reference herein in its entirety.

TECHNICAL FIELD

The various embodiments described in this document relate in general to the field of photovoltaic technologies, and more specifically to a photovoltaic cell, a method for producing the same and a photovoltaic module.

BACKGROUND

A photovoltaic cell, also referred to as a solar cell, is a component that converts light energy into electrical energy by using a photovoltaic effect. There are many types of photovoltaic cells, which may be divided into a monocrystalline silicon cell, a polycrystalline silicon cell, an amorphous silicon cell, and a compound cell. In 1975, Purdue University in the United States proposed an interdigitated back contact solar cell (IBC cell for short). In a preparation process of the IBC cell, doping is required to be performed on a silicon wafer substrate during local diffusion of phosphorus and boron. In this case, recombination is caused to some extent, and selective transport performance of carriers formed by doping is poor. In addition, an existing IBC cell is further subjected to problems such as a complex manufacturing procedure, inability to integrate with a conventional crystalline silicon cell production line, and inability to be mass-produced on a large scale.

Therefore, it is desired to provide a method for producing a photovoltaic cell, in which P-type polysilicon is converted into N-type polysilicon by using an N-type dopant, so as to improve the selective transport performance of carriers formed by doping, and to simplify and improve a manufacturing procedure of the photovoltaic cell, so that the photovoltaic cell can be integrated with the conventional crystalline silicon cell production line, to implement large-scale mass production.

SUMMARY

In view of this, embodiments of the present disclosure provide a method for producing a photovoltaic cell, including:
providing a silicon wafer, the silicon wafer having a first surface;
forming a tunneling oxide layer on the first surface of the silicon wafer and a P-type amorphous silicon layer over the tunneling oxide layer;
forming N-type dopants at intervals on a side of the P-type amorphous silicon layer away from the silicon wafer, the N-type dopants including phosphorus atoms;
performing laser processing on the N-type dopants, to cause portions of the P-type amorphous silicon layer in contact with the N-type dopants to be doped with some of the phosphorus atoms in the N-type dopants, where the P-type amorphous silicon layer is converted into an amorphous silicon layer having alternatingly arranged P-type amorphous silicon and N-type amorphous silicon;
removing remaining portions of the N-type dopants on a surface of the amorphous silicon layer and forming a protective layer over the surface of the amorphous silicon layer;
performing laser processing on the protective layer and the amorphous silicon layer, to form a groove and a protrusion;
subjecting the silicon wafer to further processing, where a depth of the groove is increased during the further processing;
removing the protective layer; and
subjecting the silicon wafer to high temperature processing, to convert the amorphous silicon layer into a polycrystalline silicon layer.

In some embodiments, after laser processing is performed on the N-type dopants, content of phosphorus atoms in the P-type amorphous silicon layer in contact with the N-type dopants is greater than content of boron atoms.

In some embodiments, the silicon wafer has a second surface opposite to the first surface, and the method includes: forming a textured structure on the second surface of the silicon wafer during the further processing.

In some embodiments, after subjecting the silicon wafer to the high temperature processing, to convert the amorphous silicon layer into the polycrystalline silicon layer, the method further includes:
simultaneously forming a passivation layer on the first surface and a second surface of the silicon wafer; and
forming an electrode on the first surface of the silicon wafer.

In some embodiments, the N-type dopants are phosphosilicate glass or wax including phosphorus elements, where a concentration of phosphorus atoms in the phosphosilicate glass is not less than $1\times10^{21}$ atoms/cm$^3$, and a mass fraction of phosphorus atoms in the wax including phosphorus elements ranges from 0.2% to 2%.

In some embodiments, removing the remaining portions of the N-type dopants on the surface of the amorphous silicon layer includes: using a tank-type device, and removing the remaining portions of the N-type dopants by using a mixed solution of potassium hydroxide and diethylene glycol butyl ether, where a concentration of the potassium hydroxide ranges from 0.1% to 0.5%, and a concentration of the diethylene glycol butyl ether ranges from 0.1% to 0.3%.

In some embodiments, a doping concentration of boron atoms in the P-type amorphous silicon layer ranges from $3.0\times10^{19}$ atoms/cm$^3$ to $3.0\times10^{20}$ atoms/cm$^3$.

In some embodiments, after the further processing, the depth of the groove is greater than a total thickness of the polysilicon layer and the tunneling oxide layer.

In some embodiments, subjecting the silicon wafer to the further processing by using a tank-type device, and by using potassium hydroxide, additives, and deionized water, where a concentration of the potassium hydroxide ranges from 1% to 1.5%, and a concentration of the additives ranges from 0.5% to 1%.

In some embodiments, removing the protective layer includes: using a tank-type device, and removing the protective layer by using a hydrogen fluoride solution, where a concentration of the hydrogen fluoride ranges from 10% to 20%.

In some embodiments, during the high temperature processing, a temperature of the high temperature processing ranges from 850° C. to 950° C.

The embodiments of the present disclosure further provide a photovoltaic cell, including a photovoltaic cell prepared by any method for producing the photovoltaic cell as described above.

The embodiments of the present disclosure further provide a photovoltaic module, including the photovoltaic cell as described above.

Compared with the related art, a photovoltaic cell and a method for producing the same and a photovoltaic module provided in the embodiments of the present disclosure at least achieve the following beneficial effects.

The embodiments of the present disclosure provide a photovoltaic cell, a method for producing the same and a photovoltaic module. The method for producing the photovoltaic cell simplifies and improves a manufacturing procedure of the photovoltaic cell. The P-type polysilicon is converted into the N-type polysilicon by using the N-type dopant, so as to improve the selective transport performance of carriers formed by doping. In this way, the type of photovoltaic cells can be integrated with the conventional crystalline silicon cell production line to implement mass-produced on a large scale, and photoelectric conversion efficiency of the photovoltaic cell is greatly improved.

Certainly, any product implementing the embodiments of the present disclosure does not necessarily need to simultaneously achieve all the technical effects.

Other features of the present disclosure and advantages thereof become apparent through the following detailed description of exemplary embodiments of the present disclosure with reference to the accompanying drawings.

BRIEF DESCRIPTION OF THE DRAWINGS

The accompanying drawings, which are incorporated in and constitute a part of this specification, illustrate embodiments of the present disclosure and together with the description serve to explain principles of the present disclosure.

DETAILED DESCRIPTION OF THE EMBODIMENTS

Various exemplary embodiments of the present disclosure are described in detail with reference to the accompanying drawings. It should be noted that relative arrangements of components and steps, numerical expressions, and numerical values that are set forth in these embodiments do not limit a scope of the present disclosure unless specifically stated otherwise.

The following description of at least one exemplary embodiment is merely illustrative in nature and in no way intended as any limitation of the present disclosure and application or use of the present disclosure.

A technique, a method, and a device that are known to a person of ordinary skill in the art may not be discussed in detail, but in proper circumstances, the technique, method, and device should be considered as a part of the specification.

In all examples shown and discussed herein, any specific value should be construed as exemplary only, and not as a limitation. Therefore, other examples of the exemplary embodiment may have different values.

It should be noted that similar numerals and letters represent similar items in the figures below. Therefore, once an item is defined in one figure, further discussion does not need to be performed on the item in subsequent figures.

Figure 1:
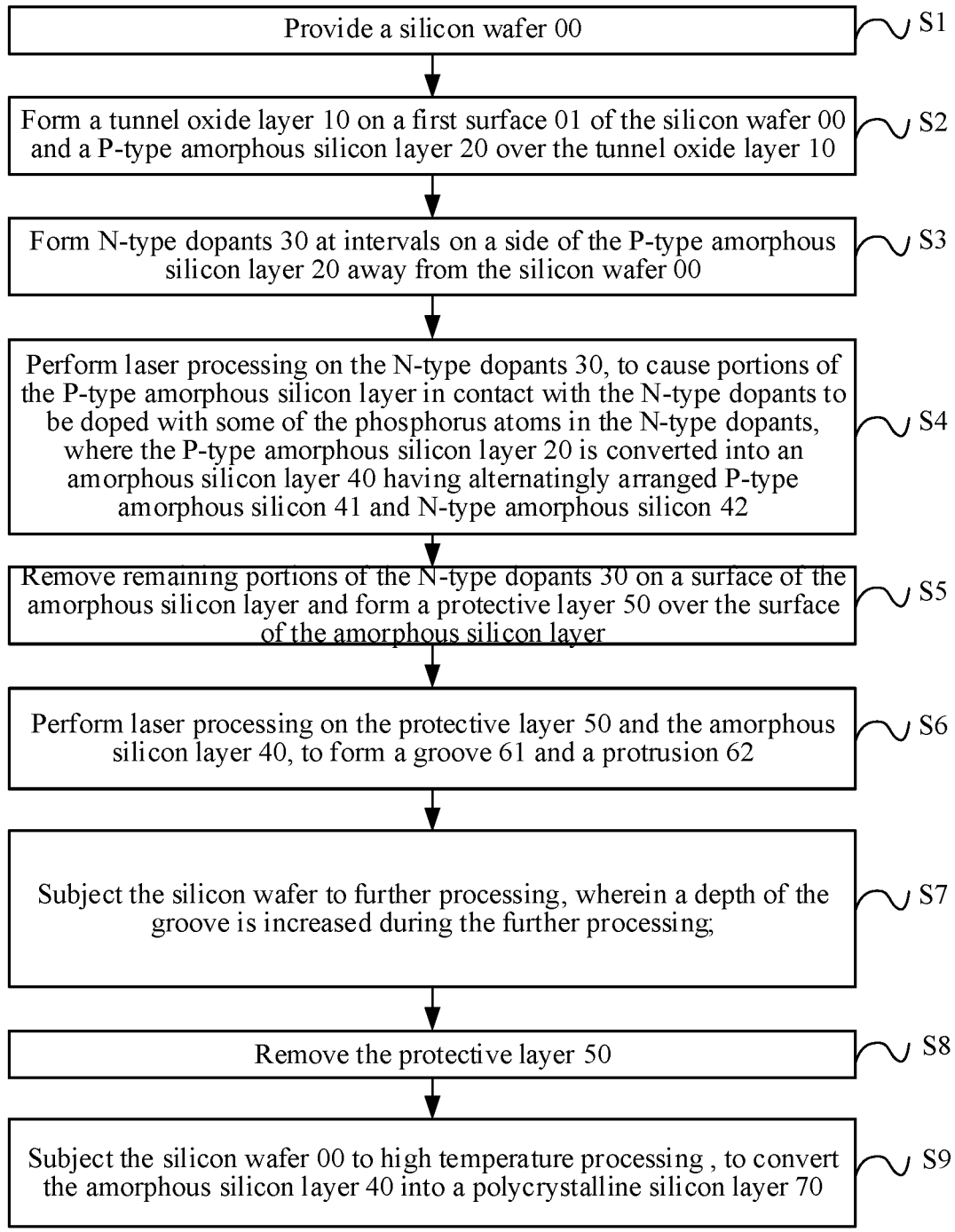
FIG. 1 is a flowchart of a method for producing a photovoltaic cell according to an embodiment of the present disclosure.
Figure 2:
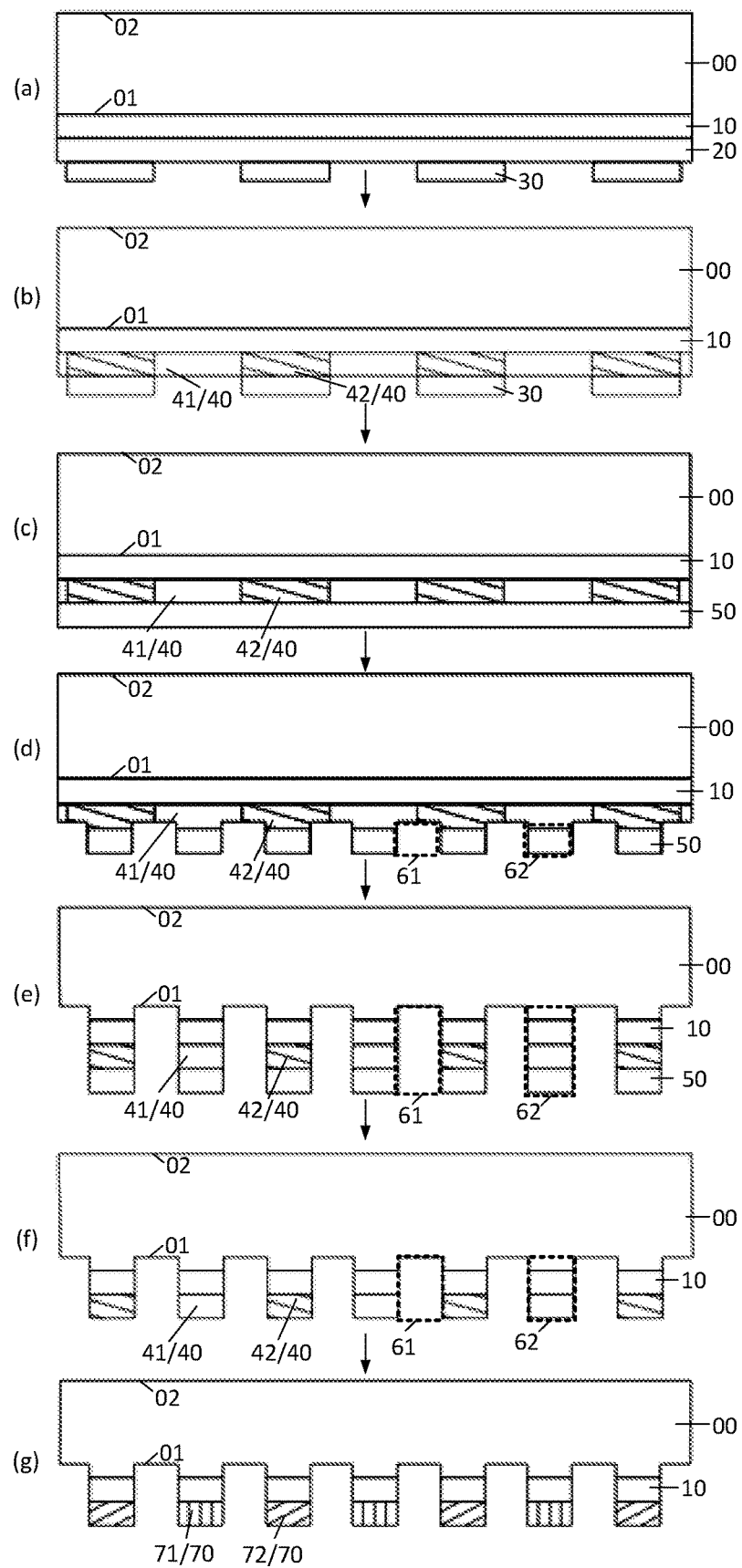
FIG. 2 is a flowchart of an implementation of a photovoltaic cell according to an embodiment of the present disclosure.
Figure 3:
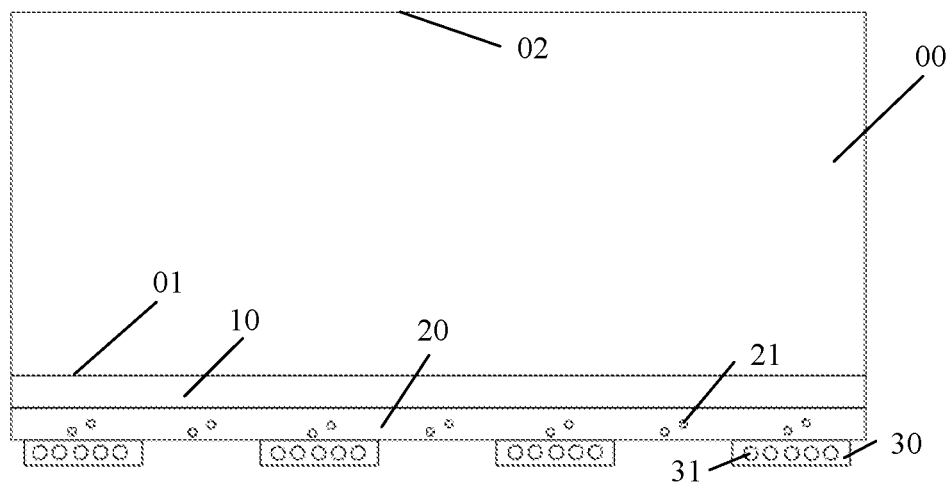
FIG. 3 is a schematic diagram of a structure of atoms in a P-type amorphous silicon layer and an N-type dopant before laser processing is performed on the N-type dopant according to an embodiment of the present disclosure.
Figure 4:
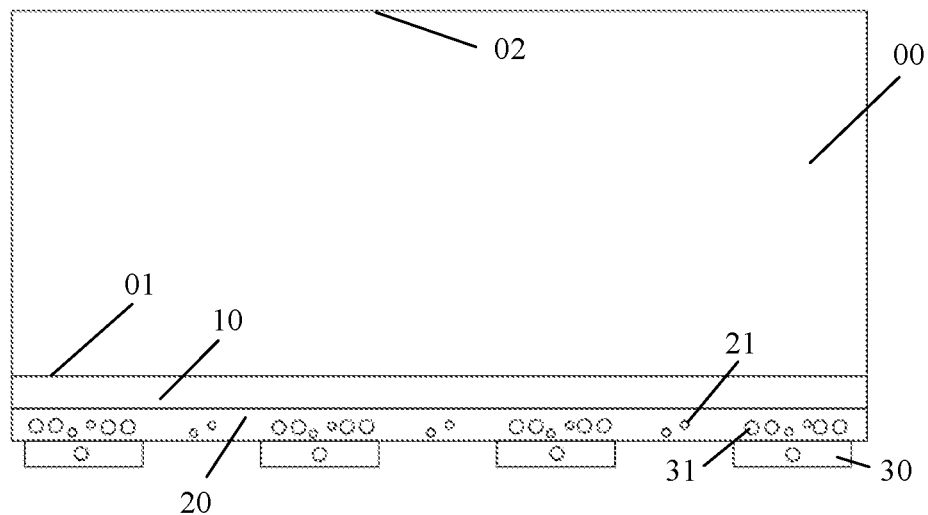
FIG. 4 is a schematic diagram of a structure of atoms in an amorphous silicon layer and an N-type dopant after laser processing is performed on the N-type dopant according to an embodiment of the present disclosure.

Referring to FIG. 1 to FIG. 4, FIG. 1 is a flowchart of a method for producing a photovoltaic cell according to an embodiment of the present disclosure, FIG. 2 is a flowchart of an implementation of a photovoltaic cell according to an embodiment of the present disclosure, FIG. 3 is a schematic diagram of a structure of atoms in a P-type amorphous silicon layer and an N-type dopant before laser processing is performed on the N-type dopant according to an embodiment of the present disclosure, and FIG. 4 is a schematic diagram of a structure of atoms in an amorphous silicon layer and an N-type dopant after laser processing is performed on the N-type dopant 30 according to an embodiment of the present disclosure. The embodiment provides a method for producing a photovoltaic cell, including the following operations.

S1, a silicon wafer 00 is provided.

Specifically, as shown in (a) of FIG. 2, the silicon wafer 00 is N-type monocrystalline silicon, has a resistivity ranging from 1 ohm·cm to 10 ohm·cm, and has a thickness ranging from 80 μm to 180 μm. The thickness of the silicon wafer 00 being set less than 80 μm may lead to a high process fragmentation rate and low yield. If the thickness of the silicon wafer 00 is set greater than 180 μm, resistance and a cost of the silicon wafer 00 are increased. Therefore, the thickness of the silicon wafer 00 is set to range from 80 μm to 180 μm. In this way, a case of the high process fragmentation rate and the low yield is avoided, and the resistance and the cost of the silicon wafer 00 can be avoided from being increased. Optionally, the thickness of the silicon wafer 00 may be 80 μm, 100 μm, 120 μm, 140 μm, 160 μm, or 180 μm.

The silicon wafer 00 has a length ranging from 156 mm to 220 mm. The length of the silicon wafer 00 being set less than 156 mm, may lead to a low production capacity and a high cost. The length of the silicon wafer 00 being set greater than 220 mm, may lead to a high fragmentation rate and great difficulty in process uniformity. Therefore, the length of the silicon wafer 00 is set to range from 156 mm to 220 mm. In this way, a low production capacity and a high cost are avoided, and a case of the high fragmentation rate and the great difficulty of process uniformity is avoided. Optionally, the length of the silicon wafer 00 may be 156 mm, 170 mm, 185 mm, 200 mm, 210 mm, or 220 mm.

It should be noted that the silicon wafer 00 as provided is a clean silicon wafer 00 on which impurities such as an organic surface film, an impurity ion, and metal contamination have been removed from a surface. A cleaning method for the silicon wafer 00 is an existing technology, and is not described herein again.

S2, a tunneling oxide layer 10 is formed on a first surface 01 of the silicon wafer 00 and a P-type amorphous silicon layer 20 is formed over the tunneling oxide layer 10.

Specifically, as shown in (a) of FIG. 2, the first surface 01 of the silicon wafer 00 is a surface (namely, a rear surface) of the silicon wafer 00 that is not exposed to sunlight. A material of the tunneling oxide layer 10 and the P-type amorphous silicon layer 20 is any one of SiOx, AlOx, and SiONx.

The tunneling oxide layer 10 is used for passivation of a rear surface of the photovoltaic cell, which can implement excellent surface passivation and selective collection of carriers, and improve conversion efficiency of the photovoltaic cell.

The tunneling oxide layer 10 has a thickness ranging from 1 nm to 1.5 nm. If the thickness of the tunneling oxide layer 10 is less than 1 nm, the tunneling oxide layer 10 is relatively thinner, which affects a passivation effect of the photovoltaic cell. If the thickness of the tunneling oxide layer 10 is greater than 1.5 nm, the tunneling oxide layer 10 is relatively thicker, which affects a tunneling effect of carriers. Therefore, by setting the thickness of the tunneling oxide layer 10 to range from 1 nm to 1.5 nm, the passivation effect of the photovoltaic cell can be avoided from being affected, and the tunneling effect of the carriers can be avoided from being affected. Optionally, the thickness of the tunneling oxide layer 10 may be 1 nm, 1.1 nm, 1.2 nm, 1.3 nm, 1.4 nm, or 1.5 nm.

The method for preparing the tunneling oxide layer 10 is to form the tunneling oxide layer 10 in a thermal oxygen manner by using a low-pressure chemical vapor deposition (hereinafter LPCVD) device. Process parameters include: a temperature ranging from 550° C. to 650° C., an oxygen flow rate ranging from 20 standard cubic centimeter per minute (hereinafter sccm) to 40 sccm, duration ranging from 400 seconds to 600 seconds, and a gas pressure in a furnace tube ranging from 500000 mTorr to 800000 mTorr (i.e. 66500 Pascal to 106400 Pascal). It should be noted that if the temperature is less than 550° C., the tunneling oxide layer 10 is relatively thinner, and if the temperature is greater than 650° C., a forming rate of the tunneling oxide layer 10 is too fast and is difficult to be controlled. If the oxygen flow rate is less than 20 sccm, the forming rate of the tunneling oxide layer 10 is slow and uneven. The oxygen flow rate being set greater than 40 sccm is of little help to the forming of the tunneling oxide layer 10 and results in waste of the cost. If the duration is less than 400 seconds, the tunneling oxide layer 10 is relatively thinner, which affects a passivation effect of the photovoltaic cell. If the duration is greater than 600 seconds, the tunneling oxide layer 10 is relatively thicker, which affects a tunneling effect of the carriers. If the gas pressure in the furnace tube is lower than 500000 mTorr, the pressure is too low so that the forming rate of the tunneling oxide layer 10 slows down. If the gas pressure in the furnace tube is greater than 800000 mTorr, the relatively higher pressure affects a mean free path of oxygen atoms, resulting in poor uniformity of the tunneling oxide layer 10.

The P-type amorphous silicon layer 20 serves as a field passivation layer, forming an energy band bend on the surface of the silicon wafer 00, to implement selective transport of carriers, and reduce recombination losses.

The P-type amorphous silicon layer 20 has a thickness ranging from 60 nm to 300 nm. If the thickness of the P-type amorphous silicon layer 20 is less than 60 nm, doping of the P-type amorphous silicon is difficult and metallization matching is also difficult. If the thickness of the P-type amorphous silicon layer 20 is greater than 300 nm, light absorption of the P-type amorphous silicon is serious. Therefore, by setting the thickness of the P-type amorphous silicon layer 20 to range from 60 nm to 300 nm, a case of the great difficulty in doping of the P-type amorphous silicon and the increased difficulty in metallization matching is avoided, and a case of the serious light absorption of the P-type amorphous silicon is avoided. Optionally, the thickness of the P-type amorphous silicon layer 20 may be 60 nm, 110 nm, 160 nm, 210 nm, 260 nm, or 300 nm.

Preparation of the P-type amorphous silicon layer 20 includes the following two operations.

Operation 1, an amorphous silicon layer is deposited by using an LPCVD device. The process parameters include: introducing silicon tetrahydride (in chemical formula $SiH_4$) gas into both a furnace tail and a furnace mouth, a gas flow rate at the furnace tail ranging from 1500 sccm to 2000 sccm, a gas flow rate at the furnace mouth ranging from 100 sccm to 200 sccm, a temperature ranging from 590° C. to 610° C., and a gas pressure ranging from 100 mtorr to 500 mtorr (i.e. 13.3 Pascal to 66.5 Pascal). It should be noted that if a gas flow rate at the furnace tail is less than 1500 sccm, amorphous silicon at the furnace tail is relatively thinner, and if a gas flow rate at the furnace tail is greater than 2000 sccm, amorphous silicon at the furnace tail is relatively thicker. If a gas flow rate at the furnace mouth is less than 100 sccm, amorphous silicon at the furnace mouth is relatively thinner, and if a gas flow rate at the furnace mouth is greater than 200 sccm, amorphous silicon at the furnace mouth is relatively thicker. If the temperature is less than 590° C., the amorphous silicon layer 20 is relatively thinner, and if the temperature is greater than 610° C., the amorphous silicon layer is relatively thicker. If the gas pressure is less than 100 mtorr, the amorphous silicon layer is relatively thinner, and if the gas pressure is greater than 500 mtorr, the amorphous silicon layer is relatively thicker, and uniformity is poor.

Operation 2, Ex-situ doping is performed on the amorphous silicon layer with boron elements by using a diffusion device.

S3, N-type dopants 30 are formed at intervals on a side of the P-type amorphous silicon layer 20 away from the silicon wafer 00.

Specifically, as shown in (a) of FIG. 2, forming the N-type dopants 30 at intervals on the side of the P-type amorphous silicon layer 20 away from the silicon wafer 00 includes the following two operations.

Operation 1, N-type dopants 30 are printed on a side of a P-type amorphous silicon layer 20 away from a silicon wafer 00 by using a screen printing machine and a screen plate.

Operation 2, the N-type dopants 30 are dried by using a chain drying oven. The process parameters include: a drying temperature ranging from 150° C. to 250° C., and drying duration ranging from 1 minute to 3 minutes. It should be noted that the drying temperature being set less than 150° C. results in mediocre drying effects, the drying temperature being set greater than 250° C. causes the N-type dopant 30 to fall off easily, the drying duration being set less than 1 min results in mediocre drying effects, and the drying duration being set greater than 3 min causes the N-type dopant 30 to fall off easily.

The N-type dopant 30 has a thickness ranging from 1 μm to 50 μm. If the thickness of the N-type dopant 30 is less than 1 μm, doping sources are insufficient. If the thickness of the N-type dopant 30 is greater than 50 µm, a drying effect is poor and materials may be wasted. Therefore, by setting the thickness of the N-type dopant 30 to range from 1 µm to 50 µm, a case of insufficient doping sources is avoided, and the poor drying effect and the waste of materials are avoided. Optionally, the thickness of the N-type dopant 30 may be 1 µm, 15 µm, 30 µm, 45 µm, or 50 µm.

S4, laser processing is performed on the N-type dopant 30, to cause portions of the P-type amorphous silicon layer in contact with the N-type dopants to be doped with some of the phosphorus atoms in the N-type dopants. The P-type amorphous silicon layer 20 is converted into an amorphous silicon layer 40 having alternatingly arranged P-type amorphous silicon 41 and N-type amorphous silicon 42.

Specifically, as shown in (b) of FIG. 2, FIG. 3, and FIG. 4, the method for performing laser processing on the N-type dopant 30 is to irradiate the N-type dopant 30 by using a nanosecond laser device. The process parameters include: a laser wavelength ranging from 300 nm to 1000 nm, a laser line width ranging from 50 µm to 120 µm, laser energy ranging from 5 W to 20 W, and an overlapping area of adjacent light spots ranging from 10% to 30%. It should be noted that if a laser wavelength is less than 300 nm, a depth of action of a light source is shallow, thereby affecting the doping effect. If a laser wavelength is greater than 1000 nm, the doping effect is affected and the laser causes great damage. If the laser line width is less than 50 µm, laser productivity is too low, and if the laser line width is greater than 120 µm, uniformity of the spot energy distribution is poor. If the laser energy is less than 5 W, a doping concentration of phosphorus atoms is insufficient, and if the laser energy is greater than 20 W, the N-type dopant 30 and the P-type amorphous silicon layer 20 may be severely damaged. If the overlapping area of adjacent light spots is less than 10%, a doping concentration of phosphorus atoms at an intersection of light spots may be insufficient. If the overlapping area of adjacent light spots is greater than 30%, the N-type dopant 30 at an intersection of energy may suffer great damage.

S5, remaining portions of the N-type dopant 30 on a surface of the amorphous silicon layer is removed and a protective layer 50 is formed over the surface of the amorphous silicon layer.

Specifically, as shown in (c) of FIG. 2, the N-type dopant 30 is first removed, and then a protective layer 50 is formed on a side of the amorphous silicon layer 40 away from the silicon wafer 00. A material of the protective layer 50 is any one of SiOx, SiONx, and SiNx, and a function of the protective layer 50 is to protect a non-opening region of the amorphous silicon layer 40.

The protective layer 50 has a thickness not less than 2 nm. If the thickness of the protective layer 50 is less than 2 nm, a protective effect of the protective layer 50 may be reduced.

A method for forming the protective layer 50 is as follows. First, a thin protective layer 50 is generated by configuring an ozone (in chemical formula $O_3$) generator and a heating apparatus disposed at a feeder of a chain machine, and then a hydrogen peroxide solution (commonly referred to as aquae hydrogenii dioxidi) is used to thicken the protective layer 50 at an ending of a tank-type device. A heating temperature of the heating apparatus ranges from 60° C. to 80° C. The heating temperature being set less than 60° C. causes the thickness of the protective layer 50 to be relatively thinner. The heating temperature being set greater than 80° C. results in a relatively higher requirement for hardware of the device, thereby increasing the process difficulty. A concentration of the hydrogen peroxide solution ranges from 1% to 2%. The concentration of the hydrogen peroxide solution being set less than 1% causes the thickness of the protective layer 50 to be relatively thinner. The concentration of the hydrogen peroxide solution being set greater than 2% results in that the hydrogen peroxide solution evaporates quickly, which is a waste of costs. The temperature of the tank-type device is 80° C., and the duration is 120 seconds.

S6, laser processing is performed on the protective layer 50 and the amorphous silicon layer 40, to form a groove 61 and a protrusion 62.

Specifically, as shown in (d) of FIG. 2, the protective layer 50 and the amorphous silicon layer 40 are irradiated by using a picosecond laser device, to form a groove 61 and a protrusion 62 that are alternately arranged. The process parameters include: a laser wavelength ranging from 300 nm to 1000 nm, a size of a laser spot ranging from 50 µm to 120 µm, laser energy ranging from 2 W to 15 W, and an overlapping area of adjacent light spots ranging from 10% to 30%. It should be noted that if a laser wavelength is less than 300 nm, a depth of action of a light source is shallow, thereby affecting the doping effect. If a laser wavelength is greater than 1000 nm, the doping effect is affected and the laser causes great damage. If a laser spot is less than 50 µm, the laser productivity is too low, and if a laser spot is greater than 120 µm, the protective layer 50 cannot be removed uniformly. If laser energy is less than 2 W, the protective layer 50 cannot be removed uniformly, and if laser energy is greater than 15 W, the laser causes great damage to the protective layer 50 and the amorphous silicon layer 40. If the overlapping area of adjacent light spots is less than 10%, the protective layer 50 cannot be removed uniformly. If the overlapping area of adjacent light spots is greater than 30%, the laser causes great damage to the protective layer 50 and the amorphous silicon layer 40.

A width (namely, a distance between adjacent grooves 61) of the protrusion 62 in a direction perpendicular to a laser irradiation direction ranges from 100 µm to 500 µm. The width of the protrusion 62 in the direction perpendicular to the laser irradiation direction being set less than 100 µm results in great difficulty of metallization alignment. The width of the protrusion 62 in the direction perpendicular to the laser irradiation direction being set greater than 500 µm affects absorption of carriers. Therefore, by setting the width of the protrusion 62 in the direction perpendicular to the laser irradiation direction to range from 100 µm to 500 µm, the difficulty of metallization alignment is reduced, and the absorption of the carriers is avoided from being affected. Optionally, the width of the protrusion 62 in the direction perpendicular to the laser irradiation direction may be 100 µm, 200 µm, 300 µm, 400 µm, or 500 µm.

A width (namely, a distance between adjacent protrusions 62) of the groove 61 in a direction perpendicular to a laser irradiation direction ranges from 100 µm to 300 µm. The width of the groove 61 in the direction perpendicular to the laser irradiation direction being set less than 1 µm results in a risk of leakage. The width of the groove 61 in the direction perpendicular to the laser irradiation direction being set greater than 50 µm affects absorption of carriers. Therefore, by setting the width of the groove 61 in the direction perpendicular to the laser irradiation direction to range from 100 µm to 300 µm, the risk of leakage is avoided, and the absorption of the carriers is avoided from being affected. Optionally, the width of the groove 61 in the direction perpendicular to the laser irradiation direction may be 100 µm, 150 µm, 200 µm, 250 µm, or 300 µm.

S7, further processing is subjected on the silicon wafer 00. A depth of the groove 61 is increased during the further processing.

Specifically, as shown in (e) of FIG. 2, a manner of performing processing on the first surface 01 of the silicon wafer 00 is etching the silicon wafer 00 by using a tank-type device. The process parameters include: a temperature of liquid medicine ranging from 80° C. to 85° C. and soaking duration ranging from 200 s to 500 s. It should be noted that the temperature of the liquid medicine being set lower than 80° C. causes an etching rate to be slow, and the temperature of the liquid medicine being set greater than 85° C. causes an etching rate to be too fast. The soaking duration being set less than 200 s causes a depth of the etched groove to be not enough. The soaking duration being set greater than 500 s causes a depth of the etched groove to be almost unchanged, which destroys the protective layer 50 and the amorphous silicon layer 40 in a region not exposed to laser irradiation.

The reason for the depth of the groove 61 that is formed after processing is performed on the first surface 01 of the silicon wafer 00 being set greater than the depth of the groove 61 that is formed after laser processing is performed on the protective layer 50 and the amorphous silicon layer 40, is to ensure that the groove 61 separates the P-type amorphous silicon 41 and the N-type amorphous silicon 42, and a gap is formed at a joint between the P-type amorphous silicon 41 and the N-type amorphous silicon 42, so as to enhance performance of the photovoltaic cell, such as a short circuit current, an open circuit voltage, and the like.

S8, the protective layer 50 is removed (as shown in (f) of FIG. 2, the operation will be explained in the embodiment below, and is not described herein again).

S9, high temperature processing is subjected on the silicon wafer 00, to convert the amorphous silicon layer 40 into a polycrystalline silicon layer 70.

Specifically, as shown in (g) of FIG. 2, the method for performing high temperature processing on the first surface 01 of the silicon wafer 00 is to convert the amorphous silicon layer 40 into a polysilicon layer 70 by using a tube furnace high temperature device. The process parameters include: a temperature ranging from 850° C. to 950° C., a gas pressure in a tube ranging from 100 mtorr to 800 mtorr (i.e. 13.3 Pascal to 106.4 Pascal), and a gas flow ratio of nitrogen and oxygen ranging from 1:1 to 5:1 when introducing mixed gas of nitrogen (in chemical formula $N_2$) and oxygen (in chemical formula $O_2$).

The temperature being set lower than 850° C. causes a conversion rate of the amorphous silicon layer 40 to the polysilicon layer 70 to be low, and the temperature being set higher than 950° C. causes an interface state density of the polysilicon layer 70 to increase. The gas pressure in the tube being set lower than 100 mtorr results in insufficient annealing in the high temperature processing process. The gas pressure in the tube being set greater than 800 mtorr results in poor uniformity of the polysilicon layer 70 generated. The gas flow ratio of nitrogen and oxygen being set less than 1:1 results in higher consumption of oxygen. The gas flow ratio of nitrogen and oxygen being set greater than 5:1, results in insufficient annealing in the high temperature processing process.

The polysilicon layer 70 serves as an emitting layer, which can further enhance transport of photogenerated carriers, thereby improving performance of the photovoltaic cell in terms of a fill factor, a short-circuit current, and an open-circuit voltage.

Compared with the related art, a method for producing a photovoltaic cell provided in this embodiment at least implements the following beneficial effects.

This embodiment provides a method for producing a photovoltaic cell, which simplifies and improves a manufacturing procedure of the photovoltaic cell. The P-type polysilicon is converted into the N-type polysilicon by using the N-type dopant, so as to improve the selective transport performance of carriers formed by doping. In this way, the type of photovoltaic cells can be integrated with the conventional crystalline silicon cell production line to implement mass-produced on a large scale, and photoelectric conversion efficiency of the photovoltaic cell is greatly improved.

In an embodiment, still referring to FIG. 3 and FIG. 4, after laser processing is performed on the N-type dopant 30, content of phosphorus atoms 31 in the P-type amorphous silicon layer 20 in contact with the N-type dopant 30 is greater than content of boron atoms 21.

Specifically, a doping concentration of phosphorus atoms 31 is not less than $2 \times 10^{20}$ atoms/cm$^3$. The doping concentration of phosphorus atoms 31 being set lower than $2 \times 10^{20}$ atoms/cm$^3$ causes contact resistance to be affected, and causes a field passivation effect to be reduced.

Generally, a doping concentration and a curve are monitored through a device including a four-probe square resistance tester device and a diffusion concentration sorter/junction depth tester (ECV tester for short), and a minority carrier lifetime passivation monitoring method is used to further assist in confirming a doping effect.

Figure 5:
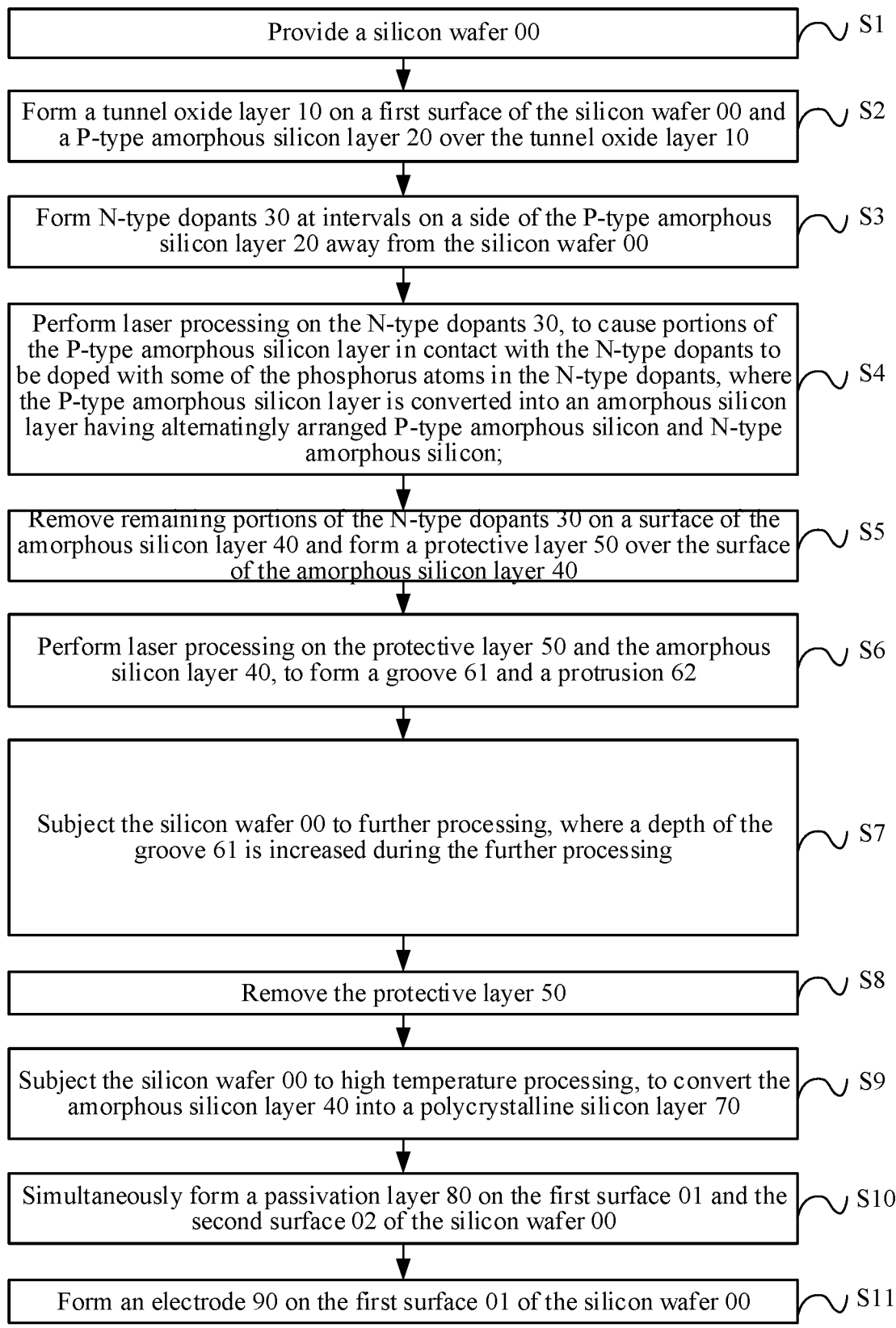
FIG. 5 is another flowchart of a method for producing a photovoltaic cell according to an embodiment of the present disclosure.
Figure 6:
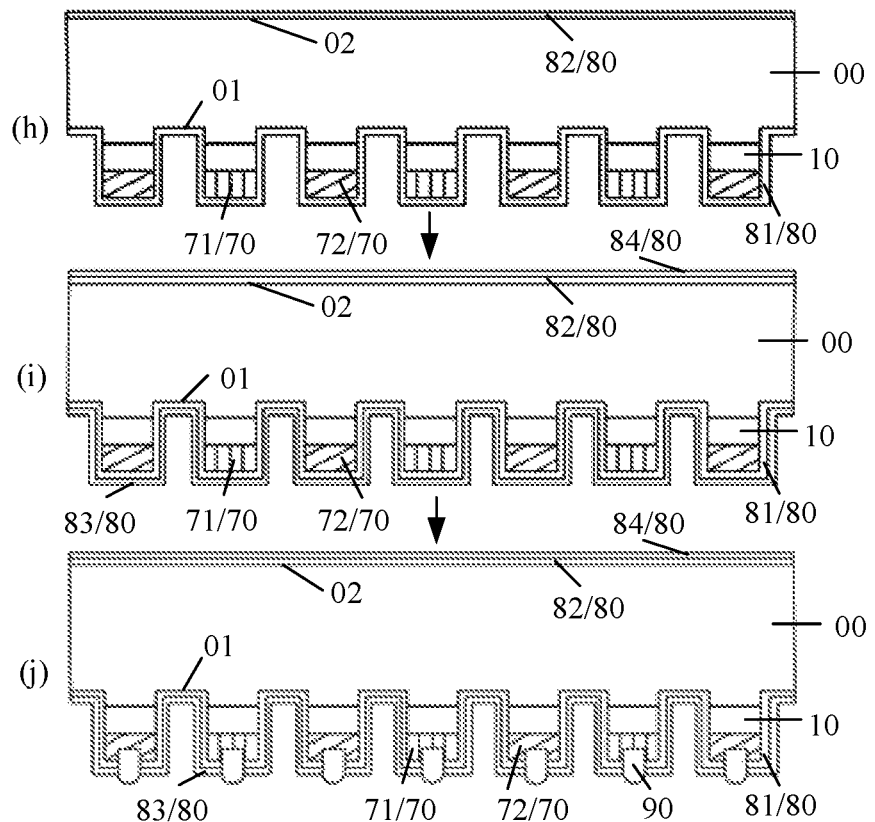
FIG. 6 is another flowchart of an implementation of a photovoltaic cell according to an embodiment of the present disclosure.

In an optional embodiment, FIG. 5 is another flowchart of a method for producing a photovoltaic cell according to an embodiment of the present disclosure, and FIG. 6 is another flowchart of an implementation of a photovoltaic cell according to an embodiment of the present disclosure. Referring to FIG. 5 and FIG. 6, when performing an operation of performing processing on the first surface 01 of the silicon wafer 00, processing is performed on a second surface 02 of the silicon wafer 00, to cause the second surface 02 of the silicon wafer 00 to form a textured structure (not shown in the figure).

Specifically, texturing processing is performed on the second surface 02 (front surface) of the silicon wafer 00, which may increase an amount of light absorbed by the silicon wafer, thereby improving photoelectric conversion efficiency of the photovoltaic cell. The textured structure is generally a pyramid, and a morphology size of the pyramid usually ranges from 1 μm to 3 μm, and a height usually ranges from 0.5 μm to 2 μm. Specifically, the morphology size being set greater than 3 μm or the height being set lower than 0.5 μm, causes surface reflectivity of the silicon wafer 00 to be reduced. The morphology size being set less than 1 μm or the height being set higher than 2 μm, causes surface passivation of the silicon wafer 00 to be deteriorated.

In an embodiment, still referring to FIG. 5 and FIG. 6, after an operation of performing high temperature processing on the first surface 01 of the silicon wafer 00, to convert the amorphous silicon layer 70 into a polycrystalline silicon layer 40, the method further includes:

simultaneously forming a passivation layer 80 on the first surface 01 and a second surface 02 of the silicon wafer 00; and forming an electrode 90 on the first surface 01 of the silicon wafer 00.

Specifically, the method for producing the photovoltaic cell provided in this embodiment further includes the following operations.

S10, a passivation layer 80 is formed simultaneously on a first surface 01 and a second surface 02 of the silicon wafer 00.

The passivation layer 80 may be two layers or three layers, and two layers are preferred in this embodiment.

The passivation layer 80 includes a first passivation layer 81 and a third passivation layer 83 that are located on the first surface 01 of the silicon wafer 00, and a second passivation layer 82 and a fourth passivation layer 84 that are located on the second surface 02 of the silicon wafer 00. Both the first passivation layer 81 and the second passivation layer 82 are film layers close to the silicon wafer 00, and both the third passivation layer 83 and the fourth passivation layer 84 are film layers away from the silicon wafer 00.

As shown in (h) of FIG. 6, a material of the first passivation layer 81 and a material of the second passivation layer 82 are SiOx or AlOx. A function is to reduce a recombination rate of the photovoltaic cell, increase the lifetime of minority carriers, and improve efficiency of the photovoltaic cell.

A thickness of the first passivation layer 81 and a thickness of the second passivation layer 82 range from 5 nm to 20 nm. The thickness of the first passivation layer 81 and the thickness of the second passivation layer 82 being set less than 5 nm causes a passivation effect of the photovoltaic cell to become worse. The thickness of the first passivation layer 81 and the thickness of the second passivation layer 82 being set greater than 20 nm, results in difficulty in burning through a paste used in subsequent preparation of the electrode 90, thereby resulting in a poor contact effect between the electrode and the silicon wafer 00. Therefore, by setting the thickness of the first passivation layer 81 and the thickness of the second passivation layer 82 to range from 5 nm to 20 nm, deterioration of the passivation effect of the photovoltaic cell is avoided, and deterioration of the contact effect between the electrode and the silicon wafer 00 is avoided. Optionally, the thickness of the first passivation layer 81 and the thickness of the second passivation layer 82 may be 5 nm, 10 nm, 15 nm or 20 nm.

There are two preparation methods for the first passivation layer 81 and the second passivation layer 82 below.

In Method 1, the method is the same as a method for forming the protective layer 50 in S5, and is not be described herein again.

In Method 2, a high temperature tube furnace device is used, to introduce mixed gas of nitrogen (in chemical formula $N_2$) and oxygen (in chemical formula $O_2$) to oxidize the silicon wafer 00. The process parameters include: a gas flow ratio of nitrogen and oxygen ranging from 1:1 to 5:1, a temperature ranging from 650° C. to 750° C., and duration ranging from 10 minutes to 20 minutes. It should be noted that the gas flow ratio of nitrogen and oxygen being set less than 1:1 causes an oxygen ratio to be low, resulting in relatively thinner and insufficient dense of the first passivation layer 81 and the second passivation layer 82. The gas flow ratio of nitrogen and oxygen being set greater than 5:1 causes an oxygen ratio to be too high, resulting in that materials is wasted. The temperature being set less than 650° C. results in relatively thinner and insufficient dense of the first passivation layer 81 and the second passivation layer 82. The temperature being set greater than 750° C. is of little help in the passivation effect and results in increase of the cost. The duration being set less than 10 minutes results in relatively thinner and insufficient dense of the first passivation layer 81 and the second passivation layer 82. The duration being set greater than 20 minutes causes the first passivation layer 81 and the second passivation layer 82 to be thick, thereby affecting cell efficiency.

As shown in (i) of FIG. 6, a material of the third passivation layer 83 and a material of the fourth passivation layer 84 may be any one of SiNx, a mixture of SiNx, SiONx, and SiOx, a mixture of SiNx and SiONx, and a mixture of SiNx and SiOx. A function is to serve as an anti-reflection layer, to enhance an amount of light absorbed by the silicon wafer 00, and improve the photoelectric conversion efficiency.

A thickness of the third passivation layer 83 ranges from 75 nm to 85 nm, and a thickness of the fourth passivation layer 84 ranges from 70 nm to 80 nm. If the thickness of the third passivation layer 83 is less than 75 nm and the thickness of the fourth passivation layer 84 is less than 70 nm, an optimal anti-reflection effect cannot be achieved. If the thickness of the third passivation layer 83 is greater than 85 nm and the thickness of the fourth passivation layer 84 is greater than 80 nm, the required process duration is extended, resulting in low efficiency, a waste of materials, and increased costs. Therefore, by setting the thickness of the third passivation layer 83 to range from 75 nm to 85 nm, and the thickness of the fourth passivation layer 84 to range from 70 nm to 80 nm, the optimal anti-reflection effect can be ensured, and problems such as prolonged process duration, low efficiency, a waste of materials, increased costs, and the like can be avoided. Optionally, the thickness of the third passivation layer 83 may be 75 nm, 77 nm, 79 nm, 81 nm, 83 nm, or 85 nm, and the thickness of the fourth passivation layer 84 may be 70 nm, 72 nm, 74 nm, 76 nm, 78 nm, or 80 nm.

Preparation methods for both the third passivation layer 83 and the fourth passivation layer 84 are a plasma enhanced chemical vapor deposition method. When preparing the third passivation layer 83 and the fourth passivation layer 84, process parameters of preparing the third passivation layer 83 and the fourth passivation layer 84 are the same except temperature. Other parameters include introducing mixed gas of silicon tetrahydride (in chemical formula $SiH_4$) and ammonia (in chemical formula $NH_3$), a gas flow ratio ranging from 1:10 to 3:10, and a gas pressure ranging from 1000 mtorr to 2000 mtorr (i.e. 133 Pascal to 266 Pascal). It should be noted that the gas flow ratio being set less than 1:10 causes a refractive index of the passivation layer to be relatively lower and the passivation effect to be poor. The gas flow ratio being set greater than 3:10, causes a refractive index of the passivation layer to be relatively higher and the contact effect to be poor. The gas pressure being set less than 1000 mtorr causes a coating rate to slow down. The gas pressure being set higher than 2000 mtorr causes uniformity of the generated film to become worse.

A temperature for preparing the third passivation layer 83 ranges from 500° C. to 570° C. The temperature for preparing the third passivation layer 83 being set less than 500° C. causes a coating rate to slow down. The temperature for preparing the third passivation layer 83 being set greater than 570° C. causes uniformity of the generated film to become worse.

A temperature for preparing the fourth passivation layer 84 ranges from 460° C. to 500° C. The temperature for preparing the fourth passivation layer 84 being set less than 460° C. causes a coating rate to slow down. The temperature for preparing the fourth passivation layer 84 being greater than 500° C. causes uniformity of the generated film to become worse.

It should be emphasized that in addition to the foregoing method, preparation of the passivation layer 80 further includes atomic layer deposition (ALD for short), reactive sputtering, magnetron sputtering (one of Physical Vapor Deposition (PVD) method), and the like. As long as the film layer described in this embodiment may be formed, a preparation method includes but is not limited thereto.

S11, an electrode 90 is formed on the first surface 01 of the silicon wafer 00.

As shown in (j) of FIG. 6, the electrode 90 may be formed on the first surface 01 of the silicon wafer 00 by using a conventional screen printing method and a conventional paste. Optionally, the electrode 90 in contact with the P-type amorphous silicon 41 is preferably made of a silver-aluminum paste. A composition proportion of silver (in chemical formula Ag) ranges from 80% to 90%, a composition proportion of aluminum (in chemical formula Al) ranges from 1% to 3%, and a width of the electrode 90 ranges from 20 μm to 40 μm. The electrode 90 in contact with the N-type amorphous silicon 42 is preferably made of a silver paste. A composition proportion of silver (in chemical formula Ag) ranges from 82% to 92%, and a width of the electrode 90 ranges from 20 μm to 40 μm. The silver-aluminum paste and the silver paste corrode the passivation layer 80 in a high temperature sintering process, and form good ohmic contact with the polysilicon layer 70 on a rear surface of the silicon wafer 00.

In addition, the electrode 90 may be further made of an aluminum paste, silver-coated copper, and the like.

It should be emphasized that in addition to the foregoing method, preparation of the electrode 90 further includes a metal evaporation method, an electroplating method, and the like. As long as the electrode 90 described in this embodiment may be formed, the preparation method includes but is not limited thereto.

A width of the electrode 90 in a direction perpendicular to a laser irradiation direction ranges from 10 μm to 80 μm. The width of the electrode 90 in the direction perpendicular to the laser irradiation direction being set less than 10 μm affects transport of carriers and increases difficulty of the process. The width of the electrode 90 in the direction perpendicular to the laser irradiation direction being set greater than 80 μm results in higher cost. Therefore, by setting the width of the electrode 90 in the direction perpendicular to the laser irradiation direction to range from 10 μm to 80 μm, results in avoiding transport of carriers from being affected, process increased difficulty of process, and a case of high costs. Optionally, the width of the electrode 90 in the direction perpendicular to the laser irradiation direction may be 10 μm, 25 μm, 40 μm, 65 μm, or 80 μm.

A depth of the electrode 90 extending into the polysilicon layer 70 ranges from 10 nm to 100 nm. The depth of the electrode 90 extending into the polysilicon layer 70 being set less than 10 nm causes contact resistance to become worse. The depth of the electrode 90 extending into the polysilicon layer 70 being set greater than 100 nm causes the passivation effect to be affected. Therefore, by setting the depth of the electrode 90 extending into the polysilicon layer 70 to range from 10 nm to 100 nm, contact resistance is avoided from deteriorating, and the passivation effect is avoided from being affected. Optionally, the depth of the electrode 90 extending into the polysilicon layer 70 may be 10 nm, 30 nm, 50 nm, 70 nm, or 100 nm.

In an embodiment, the N-type dopant 30 is phosphosilicate glass or wax including phosphorus elements. A concentration of phosphorus atoms 31 in the phosphosilicate glass is not less than $1 \times 10^{21}$ atoms/$cm^3$, and a mass fraction of phosphorus atoms 31 in the wax including phosphorus elements ranges from 0.2% to 2%.

Specifically, the concentration of phosphorus atoms 31 in the phosphosilicate glass being set less than $1 \times 10^{21}$ atoms/$cm^3$, or the mass fraction of phosphorus atoms 31 in the wax including phosphorus elements being not set to range from 0.2% to 2%, causes the doping concentration of phosphorus atoms 31 in the P-type amorphous silicon layer 20 to be relatively lower, which is not conducive to conversion of the P-type amorphous silicon 41 in the P-type amorphous silicon layer 20 into the N-type amorphous silicon 42 so that a voltage saturation effect under a high concentration condition cannot be eliminated and series resistance of the photovoltaic cell cannot be reduced. Therefore, setting the concentration of phosphorus atoms 31 in the phosphosilicate glass to be not less than $1 \times 10^{21}$ atoms/$cm^3$, or setting the mass fraction of phosphorus atoms 31 in the wax including the phosphorus elements to range from 0.2% to 2%, is conducive to conversion of the P-type amorphous silicon 41 in the P-type amorphous silicon layer 20 into the N-type amorphous silicon 42, so that a voltage saturation effect under a high concentration condition can be eliminated and series resistance of the photovoltaic cell can be reduced. Optionally, the concentration of phosphorus atoms 31 in the phosphosilicate glass may be $1 \times 10^{21}$ atoms/$cm^3$, $2 \times 10^{21}$ atoms/$cm^3$, $3 \times 10^{21}$ atoms/$cm^3$, $4 \times 10^{21}$ atoms/$cm^3$, or $5 \times 10^{21}$ atoms/$cm^3$. The mass fraction of phosphorus atoms 31 in the wax including the phosphorus elements may be 0.2%, 0.6%, 1%, 1.5%, or 2%.

In an embodiment, removing the N-type dopant 30 includes: using a tank-type device, and removing the N-type dopant 30 by using a mixed solution of potassium hydroxide and diethylene glycol butyl ether, where a concentration of the potassium hydroxide ranges from 0.1% to 0.5%, and a concentration of the diethylene glycol butyl ether ranges from 0.1% to 0.3%.

Specifically, the N-type dopant 30 is not a structure of the photovoltaic cell, which is configured to convert the P-type amorphous silicon layer 20 into an amorphous silicon layer 40 in which the P-type amorphous silicon 41 and the N-type amorphous silicon 42 are alternately arranged. Therefore, the N-type dopant 30 needs to be removed after being used. The method for removing the N-type dopant 30 includes using a tank-type device. A condition of the tank-type device needs to be controlled at normal temperature (usually 25° C.) for 60 seconds. The N-type dopant 30 is removed by using a mixed solution of potassium hydroxide and diethylene glycol butyl ether, where the concentration of the potassium hydroxide ranges from 0.1% to 0.5%, and the concentration of the diethylene glycol butyl ether ranges from 0.1% to 0.3%. If the concentration of the potassium hydroxide is less than 0.1%, the N-type dopant 30 cannot be completely removed, which affect preparation of subsequent film layers of the photovoltaic cell, ultimately affecting a structure and power generation efficiency of the entire photovoltaic cell. If the concentration of the potassium hydroxide is greater than 0.5%, an etching rate may be too fast and difficult to be controlled, which easily causes damage to the amorphous silicon layer 40, and affects the structure and power generation efficiency of the photovoltaic cell. If the concentration of the diethylene glycol butyl ether is less than 0.1%, the N-type dopant 30 cannot be completely removed, which affects preparation of subsequent film layers of the photovoltaic cell, ultimately affecting the structure and the power generation efficiency of the entire photovoltaic cell. The concentration of the diethylene glycol butyl ether being set greater than 0.3%, does not have much impact on the etching rate, and easily causes a waste of materials. Therefore, by setting the concentration of the potassium hydroxide to range from 0.1% to 0.5%, and setting the concentration of the diethylene glycol butyl ether to range from 0.1% to 0.3%, the N-type dopant 30 can be completely removed, ensuring that preparation of subsequent film layers of the photovoltaic cell, the structure and the power generation efficiency of the photovoltaic cell are not affected, and ensuring that the etching rate is controlled and the waste of materials is avoided. Optionally, the concentration of the potassium hydroxide may be 0.1%, 0.2%, 0.3%, 0.4%, or 0.5%, and the concentration of the diethylene glycol butyl ether may be 0.1%, 0.15%, 0.2%, 0.25%, or 0.3%.

In an embodiment, a doping concentration of boron atoms 21 in the P-type amorphous silicon layer 20 ranges from $3.0\times10^{19}$ atoms/cm$^3$ to $3.0\times10^{20}$ atoms/cm$^3$.

Specifically, the doping concentration of boron atoms 21 in the P-type amorphous silicon layer 20 being set less than $3.0\times10^{19}$ atoms/cm$^3$ causes contact between the electrode 90 and the P-type amorphous silicon and a field passivation effect to be deteriorated. The doping concentration of boron atoms 21 in the P-type amorphous silicon layer 20 being set greater than $3.0\times10^{20}$ atoms/cm$^3$ causes a cost and time to be wasted. Therefore, by setting the doping concentration of the boron atoms 21 in the P-type amorphous silicon layer 20 to range from $3.0\times10^{19}$ atoms/cm$^3$ to $3.0\times10^{20}$ atoms/cm$^3$, the contact between the electrode 90 and the P-type amorphous silicon and the field passivation effect are not affected, and the waste of costs and time is avoided. Optionally, the doping concentration of boron atoms 21 in the P-type amorphous silicon layer 20 may be $3.0\times10^{19}$ atoms/cm$^3$, $1.5\times10^{20}$ atoms/cm$^3$, and $3.0\times10^{20}$ atoms/cm$^3$.

In an embodiment, still referring to (d) to (e) of FIG. 2, after performing processing on the first surface 01 of the silicon wafer 00, a depth of the groove 61 is greater than a total thickness of the polysilicon layer 70 and the tunneling oxide layer 10.

Specifically, after performing processing on the first surface 01 of the silicon wafer 00, the depth of the groove 61 is greater than the total thickness of the polysilicon layer 70 and the tunneling oxide layer 10, which is equivalent to the groove 61 extending into the silicon wafer 00. In this way, the P-type amorphous silicon 41 and the N-type amorphous silicon 42 may be completely isolated, to prevent leakage.

The depth of the groove 61 extending into the silicon wafer 00 ranges from 0.2 μm to 2 μm. If the depth of the groove 61 extending into the silicon wafer 00 is less than 0.2 μm, the groove 61 cannot have a good insulation effect, resulting in a risk of leakage. The depth of the groove 61 extending into the silicon wafer 00 being set greater than 2 μm causes the passivation effect to be affected. Therefore, by setting the depth of the groove 61 extending into the silicon wafer 00 to range from 0.2 μm to 2 μm, a good insulation effect of the groove 61 can be achieved and a risk of leakage can be avoided, and the passivation effect can be avoided from being affected. Optionally, the depth of the groove 61 extending into the silicon wafer 00 may be 0.2 μm, 0.6 μm, 1 μm, 1.4 μm, 1.8 μm, or 2 μm.

In an embodiment, still referring to FIG. 5, when performing processing on the first surface 01 of the silicon wafer 00, performing processing on the second surface 02 of the silicon wafer 00 includes using a tank-type device, and simultaneously performing processing on the first surface 01 and the second surface 02 of the silicon wafer 00 by using potassium hydroxide, additives, and deionized water, where a concentration of the potassium hydroxide ranges from 1% to 1.5%, and a concentration of the additives ranges from 0.5% to 1%.

Specifically, if the concentration of the potassium hydroxide is less than 1%, a reaction rate may be too slow and time may be wasted. If the concentration of the potassium hydroxide is greater than 1.5%, a reaction rate may be too fast, resulting in difficulty in controlling the process. Therefore, setting the concentration of the potassium hydroxide to range from 1% to 1.5% avoids the reaction rate from being too slow, avoids the time from being wasted, avoids the reaction rate from being too fast, and avoids difficulty in controlling the process caused by the same. Optionally, the concentration of the potassium hydroxide may be 1%, 1.1%, 1.2%, 1.3%, 1.4%, or 1.5%.

Main ingredients of the additives include water, isopropyl alcohol (IPA for short), sodium hydroxide (in chemical formula NaOH), weak acid salts, and surfactants. The concentration of the additives being set less than 0.5% causes a reaction rate to be too fast, resulting in difficulty in controlling the process. The concentration of the additives being set greater than 1% causes a reaction rate to be too slow, resulting in waste of time. Therefore, setting the concentration of the additive to range from 0.5% to 1%, avoids the reaction rate from being too fast, avoids difficult in controlling the process caused by the same, avoids the reaction rate from being too slow and avoids the waste of the time. Optionally, the concentration of the additives may be 0.5%, 0.6%, 0.7%, 0.8%, 0.9%, or 1%.

In an embodiment, still referring to (e) to (f) of FIG. 2, removing the protective layer 50 includes using a tank-type device, and removing the protective layer 50 by using a hydrogen fluoride solution, where a concentration of the hydrogen fluoride ranges from 10% to 20%.

Specifically, if the concentration of the hydrogen fluoride is set less than 10%, the protective layer 50 cannot be completely removed and removal time is too long. The concentration of the hydrogen fluoride being set greater than 20% leads to a waste of materials. Therefore, setting the concentration of the hydrogen fluoride to range from 10% to 20%, avoids a case that the protective layer 50 cannot be completely removed and the removal time is too long, and avoids the waste of materials. Optionally, the concentration of the hydrogen fluoride may be 10%, 12%, 14%, 16%, 18%, or 20%.

In an embodiment, in performing high temperature processing on the first surface 01 of the silicon wafer 00, a temperature of the high temperature processing ranges from 850° C. to 950° C.

Specifically, if the temperature of the high temperature processing is lower than 850° C., a conversion rate of the amorphous silicon layer 40 to the polysilicon layer 70 is low, and if the temperature of the high temperature processing is higher than 950° C., an interface state density of the polysilicon layer 70 increases. Therefore, setting the temperature of the high temperature processing to range from 850° C. to 950° C. ensures a conversion rate of the amorphous silicon layer 40 to the polysilicon layer 70, and avoids an increase in the interface state density of the polysilicon layer 70. Optionally, the temperature of the high temperature processing may be 850° C., 870° C., 890° C., 910° C., 930° C., or 950° C.

Figure 7:
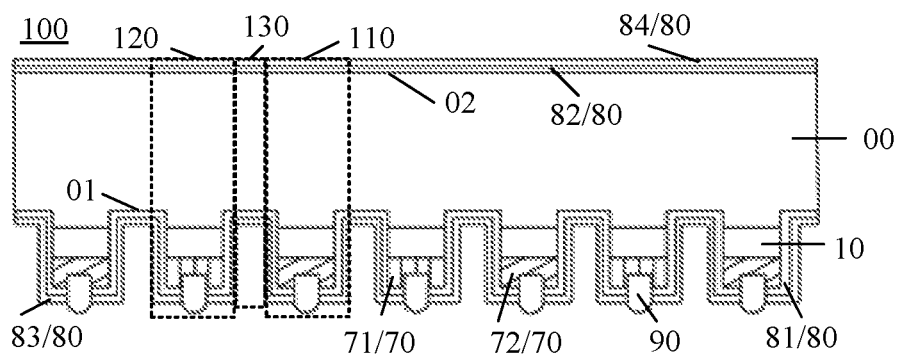
FIG. 7 is a schematic diagram of a structure of a photovoltaic cell according to an embodiment of the present disclosure.

FIG. 7 is a schematic diagram of a structure of a photovoltaic cell according to an embodiment of the present disclosure. Referring to FIG. 7, the photovoltaic cell 100 includes a photovoltaic cell prepared by any method for producing the photovoltaic cell as described above.

Specifically, in a direction perpendicular to an illumination direction, the photovoltaic cell 100 includes a groove region 130, and a first electrode region 110 and a second electrode region 120 that are separately located on two sides of the groove region 130. In the illumination direction, the groove region 130 sequentially includes a fourth passivation layer 84, a second passivation layer 82, a silicon wafer 00, a first passivation layer 81, and a third passivation layer 83. The first electrode region 110 sequentially includes a fourth passivation layer 84, a second passivation layer 82, a silicon wafer 00, a tunneling oxide layer 10, N-type polysilicon 72, a first passivation layer 81, a third passivation layer 83, and an electrode 90. The second electrode region 120 sequentially includes a fourth passivation layer 84, a second passivation layer 82, a silicon wafer 00, a tunneling oxide layer 10, P-type polysilicon 71, a first passivation layer 81, a third passivation layer 83, and an electrode 90.

Figure 8:
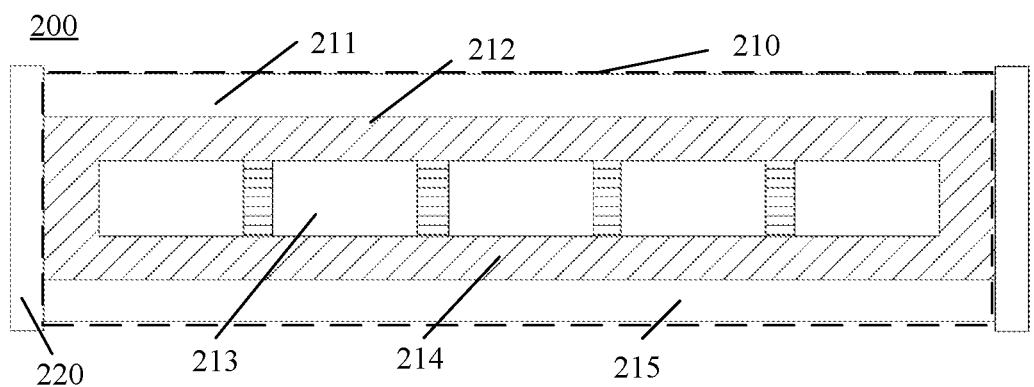
FIG. 8 is a schematic diagram of a structure of a photovoltaic module according to an embodiment of the present disclosure.

FIG. 8 is a schematic diagram of a structure of a photovoltaic module according to an embodiment of the present disclosure. Referring to FIG. 8, the photovoltaic module 200 includes a photovoltaic cell 100 prepared by any method for producing the photovoltaic cell as described above.

Specifically, the photovoltaic module 200 provided in this embodiment includes a laminate 210 and a photovoltaic module frame 220 wrapped around the laminate 210. The laminate 210 sequentially includes a front plate 211, a first encapsulating film 212, at least one group of cell strings 213, a second encapsulating film 214, and a back plate 215 in an illumination direction. The cell string 213 includes photovoltaic cells 100 prepared by any method for producing the photovoltaic cell as described above. Others are existing structures, and are not described herein again.

It may be learnt from the foregoing embodiments, a photovoltaic cell and a method for producing the same and a photovoltaic module provided in the embodiments of the present disclosure at least implement the following beneficial effects.

The embodiments of the present disclosure provide a photovoltaic cell, a method for producing the same and a photovoltaic module. The method for producing the photovoltaic cell simplifies and improves a manufacturing procedure of the photovoltaic cell. The P-type polysilicon is converted into the N-type polysilicon by using the N-type dopant, so as to improve the selective transport performance of carriers formed by doping. In this way, the type of photovoltaic cells can be integrated with the conventional crystalline silicon cell production line to implement mass-produced on a large scale, and photoelectric conversion efficiency of the photovoltaic cell is greatly improved.

Although some specific embodiments of the present disclosure have been described in detail through examples, a person skilled in the art should understand that the foregoing examples are for description only, and not intended to limit the scope of the present disclosure. It should be understood by a person skilled in the art that modifications may be made to the foregoing embodiments without departing from the scope and spirit of the present disclosure. The scope of the present disclosure is limited by the appended claims.

What is claimed is:

1. A method for producing a photovoltaic cell, comprising:
   providing a silicon wafer, the silicon wafer having a first surface;
   forming a tunneling oxide layer on the first surface of the silicon wafer and a P-type amorphous silicon layer over the tunneling oxide layer;
   forming N-type dopants at intervals on a side of the P-type amorphous silicon layer away from the silicon wafer, the N-type dopants including phosphorus atoms;
   performing laser processing on the N-type dopants, to cause portions of the P-type amorphous silicon layer in contact with the N-type dopants to be doped with some of the phosphorus atoms in the N-type dopants, wherein the P-type amorphous silicon layer is converted into an amorphous silicon layer having alternatingly arranged P-type amorphous silicon and N-type amorphous silicon;
   removing remaining portions of the N-type dopants on a surface of the amorphous silicon layer and forming a protective layer over the surface of the amorphous silicon layer;
   performing laser processing on the protective layer and the amorphous silicon layer, to form a groove and a protrusion;
   subjecting the silicon wafer to further processing, wherein a depth of the groove is increased during the further processing;
   removing the protective layer; and
   subjecting the silicon wafer to high temperature processing, to convert the amorphous silicon layer into a polycrystalline silicon layer;
   wherein the groove is configured to extend through the polycrystalline silicon layer and the tunneling oxide layer and into the silicon wafer.

2. The method according to claim 1, wherein after the laser processing is performed on the N-type dopants, content of phosphorus atoms in the P-type amorphous silicon layer in contact with the N-type dopants is greater than content of boron atoms.

3. The method according to claim 1, wherein the silicon wafer has a second surface opposite to the first surface; the method comprises: forming a textured structure on the second surface of the silicon wafer during the further processing.

4. The method according to claim 1, wherein after subjecting the silicon wafer to the high temperature processing, to convert the amorphous silicon layer into the polycrystalline silicon layer, the method further includes:
   simultaneously forming a passivation layer on the first surface and a second surface of the silicon wafer; and
   forming an electrode on the first surface of the silicon wafer.

5. The method according to claim 2, wherein the N-type dopants are phosphosilicate glass or wax including phosphorus elements, wherein a concentration of phosphorus atoms in the phosphosilicate glass is not less than $1 \times 10^{21}$ atoms/cm$^3$, and a mass fraction of phosphorus atoms in the wax comprising phosphorus elements ranges from 0.2% to 2%.

6. The method according to claim 1, wherein removing the remaining portions of the N-type dopants on the surface of the amorphous silicon layer includes: using a tank-type device, and removing the remaining portions of the N-type dopants by using a mixed solution of potassium hydroxide and diethylene glycol butyl ether, wherein a concentration of the potassium hydroxide ranges from 0.1% to 0.5%, and a concentration of the diethylene glycol butyl ether ranges from 0.1% to 0.3%.

7. The method according to claim 1, wherein a doping concentration of boron atoms in the P-type amorphous silicon layer ranges from $3.0 \times 10^{19}$ atoms/cm$^3$ to $3.0 \times 10^{20}$ atoms/cm$^3$.

8. The method according to claim 1, wherein after the further processing, the depth of the groove is greater than a total thickness of the polysilicon layer and the tunneling oxide layer.

9. The method according to claim 3, wherein subjecting the silicon wafer to the further processing by using a tank-type device, and by using potassium hydroxide, additives, and deionized water, wherein a concentration of the potassium hydroxide ranges from 1% to 1.5%, and a concentration of the additives ranges from 0.5% to 1%.

10. The method according to claim 1, wherein removing the protective layer includes: using a tank-type device, and removing the protective layer by using a hydrogen fluoride solution, wherein a concentration of the hydrogen fluoride ranges from 10% to 20%.

11. The method according to claim 1, wherein during the high temperature processing, a temperature of the high temperature processing ranges from 850° C. to 950° C.

12. The method according to claim 1, wherein the silicon wafer has a thickness ranging from 80 μm to 180 μm.

13. The method according to claim 1, wherein the silicon wafer has a length ranging from 156 mm to 220 mm.

14. The method according to claim 1, wherein the silicon wafer as provided is a clean silicon wafer on which impurities have been removed from a surface.

15. The method according to claim 1, wherein the first surface of the silicon wafer is a surface of the silicon wafer that is not exposed to sunlight.

16. The method according to claim 1, wherein the tunneling oxide layer has a thickness ranging from 1 nm to 1.5 nm.

17. The method according to claim 1, wherein the P-type amorphous silicon layer has a thickness ranging from 60 nm to 300 nm.

18. The method according to claim 1, wherein the N-type dopants have a thickness ranging from 1 μm to 50 μm.

* * * * *